(12) United States Patent
Liu et al.

(10) Patent No.: US 7,161,520 B2
(45) Date of Patent: Jan. 9, 2007

(54) HIGH PRECISION ANALOG TO DIGITAL CONVERTER

(75) Inventors: Liusheng Liu, San Jose, CA (US); Guoxing Li, Sunnyvale, CA (US)

(73) Assignee: O2Micro International Limited, Grand Cayman (KY)

( * ) Notice: Subject to any disclaimer, the term of this patent is extended or adjusted under 35 U.S.C. 154(b) by 0 days.

(21) Appl. No.: 10/838,563

(22) Filed: May 4, 2004

(65) Prior Publication Data

US 2004/0201511 A1    Oct. 14, 2004

Related U.S. Application Data

(63) Continuation of application No. 10/142,503, filed on May 10, 2002, now Pat. No. 6,744,394.

(51) Int. Cl.
*H03M 1/12* (2006.01)

(52) U.S. Cl. ........................................ 341/155; 341/172
(58) Field of Classification Search ................ 341/172, 341/166, 143, 120; 327/553, 554; 702/190
See application file for complete search history.

(56) References Cited

U.S. PATENT DOCUMENTS

| | | | | |
|---|---|---|---|---|
| 3,810,152 A | * | 5/1974 | White | 341/120 |
| 4,764,753 A | * | 8/1988 | Yukawa | 341/166 |
| 4,876,544 A | | 10/1989 | Kuraishi | 341/166 |
| 4,939,516 A | * | 7/1990 | Early | 341/143 |
| 4,968,987 A | | 11/1990 | Naka et al. | 341/143 |
| 4,999,634 A | | 3/1991 | Brazdrum et al. | 341/172 |
| 5,079,550 A | * | 1/1992 | Sooch et al. | 341/143 |
| 5,189,419 A | * | 2/1993 | Lyden | 341/143 |
| 5,229,772 A | * | 7/1993 | Hanlon | 341/172 |
| 5,323,158 A | * | 6/1994 | Ferguson, Jr. | 341/143 |
| 5,392,043 A | * | 2/1995 | Ribner | 341/143 |
| 5,408,235 A | * | 4/1995 | Doyle et al. | 341/143 |
| 5,495,200 A | * | 2/1996 | Kwan et al. | 327/553 |
| 5,579,247 A | * | 11/1996 | Kerth et al. | 702/190 |
| 5,719,573 A | * | 2/1998 | Leung et al. | 341/143 |

(Continued)

FOREIGN PATENT DOCUMENTS

TW            191309            9/1992

OTHER PUBLICATIONS

Boser, Bernard E. and Wooley, Bruce A., The Design of Sigma-Delta Modulation Analog-to-Digital Converters, Dec. 1988, pp. 293-303.

(Continued)

*Primary Examiner*—Jean Bruner Jeanglaude
(74) *Attorney, Agent, or Firm*—Grossman, Tucker, Perreault & Pfleger PLLC

(57) ABSTRACT

An analog to digital converter (ADC) includes a cross switch array coupled between an input switch array and an integrator configured to alternately transfer charges from a first input capacitor and a second input capacitor to a first integration capacitor and a second integration capacitor thereby improving linearity problems caused by capacitor mismatching. The cross switch array may also be configured to transfer charges from the first input capacitor to the first integration capacitor and from the second input capacitor to the second integration capacitor during a first charge transfer time interval, and from the first input capacitor to the second integration capacitor and from the second input capacitor to the first integration capacitor during a second charge transfer time interval. A sensing system including and ADC consistent with the invention is also provided. Various methods of transferring charges in an ADC are also provided.

13 Claims, 3 Drawing Sheets

U.S. PATENT DOCUMENTS

| | | | | |
|---|---|---|---|---|
| 5,894,284 | A * | 4/1999 | Garrity et al. | 341/172 |
| 5,920,275 | A * | 7/1999 | Hester | 341/172 |
| 5,959,562 | A * | 9/1999 | Wiesbauer | 341/143 |
| 5,982,313 | A * | 11/1999 | Brooks et al. | 341/143 |
| 6,040,793 | A * | 3/2000 | Ferguson et al. | 341/143 |
| 6,130,633 | A * | 10/2000 | Lee et al. | 341/143 |
| 6,362,761 | B1 * | 3/2002 | Bonardi et al. | 341/143 |
| 6,400,302 | B1 * | 6/2002 | Amazeen et al. | 341/172 |
| 6,437,720 | B1 * | 8/2002 | Yin et al. | 341/150 |
| 6,509,790 | B1 * | 1/2003 | Yang | 327/554 |
| 6,522,276 | B1 * | 2/2003 | Andre et al. | 341/143 |
| 6,593,870 | B1 * | 7/2003 | Dummermuth et al. | 341/155 |
| 6,630,898 | B1 * | 10/2003 | Stegers | 341/172 |
| 6,714,886 | B1 * | 3/2004 | Sung et al. | 702/107 |

OTHER PUBLICATIONS

English Translation of Taiwan Office Action dated Jan. 10, 2005 (10 pgs).

Supplementary European Search Report in related European Patent Application No. EP03721907 (2 pages).

* cited by examiner

HIGH PRECISION ANALOG TO DIGITAL CONVERTER

This application is a continuation of, and claims priority to, application Ser. No. 10/142,503 filed May 10, 2002 which is now a U.S. Pat. No. 6,744,394, which is hereby incorporated by reference.

FIELD OF THE INVENTION

This invention relates to analog to digital converters, and more particularly to a high precision analog to digital converter (ADC) compensating for capacitor mismatch errors in a switched capacitor ADC.

BACKGROUND OF THE INVENTION

Analog to digital converters (ADCs) convert analog input signals into digital signals. Such ADCs are used in many applications such as video, audio, and signal sensing applications. One type of ADC is sigma-delta converter utilizing over-sampling techniques. Such an ADC generally includes an analog modulator portion and digital filtering and decimation portion. The analog modulator portion essentially digitizes an analog input signal at very high sampling rates, i.e., sampling rates greater than the Nyquist rate, in order to perform a noise shaping function. Then, the digital filtering portion allows the ADC to achieve a high resolution. Decimation is thereafter used to reduce the effective sampling rate back to the Nyquist rate.

It is known that the analog modulator portion may generally include a feed forward path including a summing circuit, a filter, and a single bit A/D converter. A feed back path may further include a single bit digital to analog converter (DAC) coupled to the output of the single bit A/D converter and the summation circuit to provide a negative feed back signal to the summation circuit. Besides accepting the feed back signal from the DAC, the summation circuit also accepts an input analog signal for conversion.

In a switched capacitor ADC having a pair of input terminals to accept an input analog signal, an input switch array including a pair of input capacitors coupled to associated input terminals may be provided. In addition, an integrator having a pair of integration capacitors may act as the filter. The integrator may be further coupled to a comparator which functions as the A/D converter.

Ideally, the pair of input capacitors is matched with each other and the pair of integration capacitors is matched with each other. However, some capacitor mismatch is generally inevitable resulting in mismatched gain and offset. This can cause unacceptable non-linearity and offset problems where a high precision ADC is required.

Accordingly, there is a need for an apparatus and method that overcomes the above deficiencies in the prior art to allow for ADC with improved precision performance in the presence of capacitor mismatching.

BRIEF SUMMARY OF THE INVENTION

An ADC consistent with the invention includes: an input switch array having a first output and a first input and a first input capacitor coupled between the first input and the first output, the input switch array also has a second output and a second input and a second input capacitor coupled between the second input and the second output; an integrator having a first integrator output and a first integrator input and a first integrator capacitor coupled between the first integrator input and the first integrator output, the integrator also having a second integrator output and a second integrator input and a second integrator capacitor coupled between the second integrator input and the second integrator output; and a cross switch array coupled between the input switch array and the integrator configured to alternately transfer charges from the first input capacitor and the second input capacitor to the first integration capacitor and the second integration capacitor.

An ADC consistent with the invention may also include a cross switch array configured to transfer charges from the first input capacitor to the first integration capacitor and from the second input capacitor to the second integration capacitor during a first charge transfer time interval, and wherein the cross switch array is further configured to transfer charges from the first input capacitor to the second integration capacitor and from the second input capacitor to the first integration capacitor during a second charge transfer time interval.

In another embodiment, an ADC consistent with the invention may also include: an analog modulator configured to receive an analog input signal and output a sampled signal representative of the analog input signal; and a digital filter configured to receive the sampled signal and output a digital signal representative of the analog input signal, wherein the analog modulator includes: a feed forward path configured to accept the analog input signal and provide the sampled signal to the digital filter; and a feed back path having a digital to analog converter (DAC) configured to accept the sampled signal and convert the sampled signal to a feed back analog signal, wherein the DAC includes: a reference terminal configured to receive a reference signal; and a first conductive path coupled to the reference terminal and a first node, wherein the first conductive path includes a first reference capacitor and a plurality of switches, wherein the plurality of switches of the first conductive path are responsive to an associated plurality of control signals to create a positive reference signal at the first node during a first time interval and a negative reference signal at the first node during a second time interval.

An analog modulator for use in an analog to digital converter consistent with the invention includes: a pair of input capacitors including a first input capacitor and a second input capacitor; a pair of integration capacitors including a first integration capacitor and a second integration capacitor; and a cross switch array coupled between the pair of input capacitors and the pair of integration capacitors configured to cross couple the pair of input capacitors to the pair of integration capacitors during a charge transfer time interval.

A DAC consistent with the invention includes: a reference terminal configured to receive a reference signal; and a first conductive path coupled to the reference terminal and a first node, wherein the first conductive path includes a first reference capacitor and a plurality of switches, wherein the plurality of switches of the first conductive path are responsive to an associated plurality of control signals to create a positive reference signal at the first node during a first time interval and a negative reference signal at the first node during a second time interval.

In another embodiment, an ADC consistent with the invention includes: an integrator having an integrator input and an integrator output; a comparator having a comparator input coupled to the integrator output, wherein the comparator is configured to output digital data samples during a first comparison time interval and a second non-overlapping comparison time interval; and a feedback switching circuit configured to accept a reference source and the digital data samples and provide a feedback signal to the integrator, wherein noise from said reference source is dissipated by having a first charge transfer time interval and a second non-overlapping charge transfer time interval occurring after the first comparison time interval and before the second comparison time interval.

A sensing system consistent with the invention includes: a power source having a power characteristic; a sensor configured to sense the power characteristic and provide a first analog signal and a second analog signal representative of the power characteristic; and an ADC configured to accept the first and second analog signal and provide a digital signal representative of the first and second analog signal, wherein the ADC includes: an input switch array having a first output and a first input and a first input capacitor coupled between the first input and the first output, the input switch array also having a second output and a second input and a second input capacitor coupled between the second input and the second output, wherein the first input is configured to receive the first analog signal and the second input is configure to receive the second analog signal; an integrator having a first integrator output and a first integrator input and a first integrator capacitor coupled between the first integrator input and the first integrator output, the integrator also having a second integrator output and a second integrator input and a second integrator capacitor coupled between the second integrator input and the second integrator output; and a cross switch array coupled between the input switch array and the integrator configured to alternately transfer charges from the first input capacitor and the second input capacitor to the first integration capacitor and the second integration capacitor.

A method of transferring charges in an analog to digital converter from a first input capacitor and a second input capacitor to a first integration capacitor and a second integration capacitor consistent with the invention includes the steps of: transferring charges from the first input capacitor to the first integration capacitor and from the second input capacitor to the second integration capacitor during a first charge transfer time interval; and transferring charges from the first input capacitor to the second integration capacitor and from the second input capacitor to the first integration capacitor during a second charge transfer time interval.

A method of converting an input analog signal to digital output samples consistent with the invention includes the steps of: charging a first input capacitor and a second input capacitor by the input analog signal during a first and a third non-overlapping time interval; and transferring charges alternately from the first input capacitor and the second input capacitor to a first integration capacitor and a second integration capacitor during a second and a fourth non-overlapping time interval.

A method of sampling and transferring charges in an ADC consistent with the invention includes the steps of: providing a first analog signal to a first input terminal and a second analog signal to a second input terminal of the ADC; sampling the first analog signal at a first input capacitor during a first sampling time interval and the second analog signal at a second input capacitor during the first sampling time; transferring charges sampled by the first input capacitor to a first integration capacitor and charges sampled by the second input capacitor to a second integration capacitor during a first charge transfer time interval; sampling the second analog signal at said first input capacitor and the first analog signal at the second input capacitor during a second sampling time interval; and transferring charges sampled by the first input capacitor to the second integration capacitor and charges sampled by the second input capacitor to the first integration capacitor during a second charge transfer time interval.

Finally, a method of reducing the effects of noise from a reference signal source used in a DAC, where the DAC is coupled to a feedback path of an ADC, consistent with the invention includes the steps of: charging a first reference capacitor and a second reference capacitor of the DAC by the reference signal during a first and a third non-overlapping time interval; transferring charges alternately from the first reference capacitor and the second reference capacitor to a first integration capacitor and a second integration capacitor during a second and a fourth non-overlapping time interval; and comparing charges transferred with a reference charge in a fifth time interval, wherein the fourth time interval occurs after the second time interval, and the fifth time interval occurs after the fourth time interval.

BRIEF DESCRIPTION OF THE DRAWINGS

For a better understanding of the present invention, together with other objects, features and advantages, reference should be made to the following detailed description which should be read in conjunction with the following figures wherein like numerals represent like parts.

DETAILED DESCRIPTION

Figure 1:
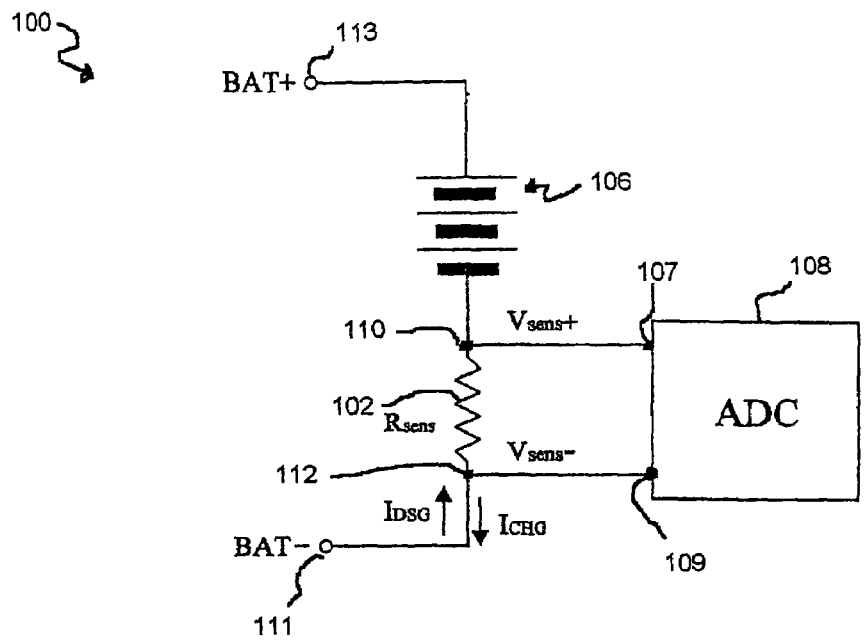
FIG. 1 is a block diagram of one exemplary application of an ADC consistent with the invention.

Turning to FIG. 1, an exemplary sensing system 100 including a sense resistor 102 and an ADC 108 consistent with the invention is illustrated. Those skilled in the art will recognize a variety of systems and sensing systems for accepting a variety of input analog signals, e.g., voltage or current signals, where an ADC 108 consistent with the invention may be utilized. In the exemplary system 100 of FIG. 1, a current sensor, e.g., the sense resistor 102, is in series with a power source such as the rechargeable battery 106, e.g., lithium, nickel-cadmium, or nickel-metal hydride battery. The sense resistor 102 may be used to sense charging and discharging current from the battery 106 by providing a pair of input analog signals to the ADC 108 at input terminals 107, 109.

The charging and discharging current from the battery 106 is indirectly sensed by measuring the voltage across the sense resistor 102 since the charging or discharging current level is equal to the measured voltage level across terminals 110, 112 divided by the resistance value of the sense resistor 102. In order to decrease the power wasted by the sense resistor 102, many applications utilize a sense resistor having a small predetermined value, e.g., about 10 mΩ. Accordingly, the voltage across the sense resistor 102 input to the ADC 108 is also quite small, e.g., about 20 mV. Therefore, it is desirable to have a high precision ADC 108 consistent with the invention for accepting and accurately converting such small analog input signals into a digital signal.

In addition, an ADC 108 consistent with the invention may also have the ability to detect such low voltage analog signals just above and below ground level. This is because the negative battery terminal 111 is typically system ground such that when charging the battery 106, the charging current flows in a direction from terminal 110 to terminal 112 as illustrated in FIG. 1. Therefore, the voltage across the sense resistor 102 in this instance is positive, e.g., V=(Vsense+)−(Vsense−), where (Vsense+)>(Vsense−). In contrast, discharging current flows in an opposite direction such that the voltage across the sense resistor 102 is negative, e.g., V=(Vsense+)−(Vsense−), where (Vsense+)< (Vsense−).

Figure 2:
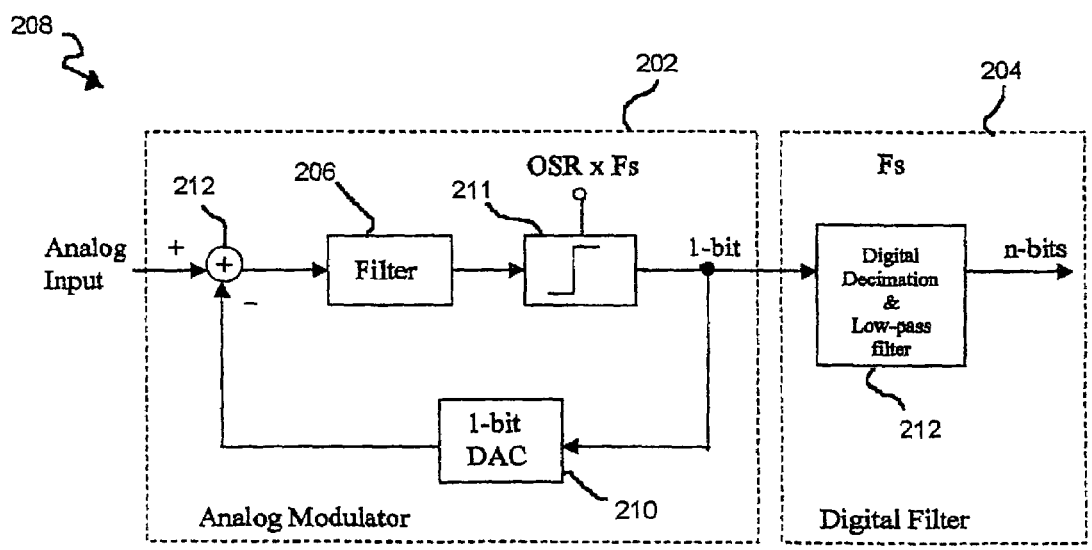
FIG. 2 is a block diagram illustrating an ADC consistent with the invention having an analog modulator and digital filter portion.

Turning to FIG. 2, a block diagram of an exemplary ADC 208 is illustrated. The exemplary ADC 208 is a sigma-delta oversampling ADC including an analog modulator portion 202 and a digital filter portion 204. In general, the analog modulator portion 202 receives an input analog signal and provides a high frequency 1-bit data stream to the digital filter portion 204. The input analog signal may be any variety of analog signals, e.g., current or voltage signals. For instance, in one of many examples, the analog signal may be a voltage signal such as that obtained from the voltage across the sense resistor 102 of FIG. 1.

The analog modulator portion 202 samples the input analog signal at a high sampling frequency equal to Fs×OSR, where Fs is the Nyquist Frequency and OSR is the over sampling ratio to the Nyquist Frequency. For a given analog input signal having a highest frequency component equal to fmax, the Nyquist Frequency is 2fmax or twice the highest analog frequency component. The analog modulator 202 converts the input analog signal into a continuous stream of 1s and 0s at a rate determined by the sampling frequency rate or Fs×OSR. The analog modulator portion may include a low pass filter 206, a comparator 211, and a 1-bit DAC 210 in a negative feedback loop to a summation circuit 212.

The high quantization noise of the comparator 211, having just 1-bit resolution, in the signal band (<Fs/2) may be suppressed by the high gain of the low pass filter 206 at low frequency. The noise at high frequency levels may not be suppressed by the low pass filter 206, but is typically outside of the signal band of interest and can be filtered out by the digital low pass filter 212. The digital low pass filter 212 accepts the high frequency 1-bit data from the analog modulator portion 202 and processes and low pass filters such signal to output a very high resolution, e.g., more than 14-bits, output at a normal Nyquist frequency Fs.

Depending on the order of the low pass filter 206, the analog modulator 202 may function as a first order modulator, second order modulator, etc. Theoretically, the higher the OSR the higher resolution that can be obtained, and the higher the modulator order the higher resolution that can be obtained. In a power source sensing system application as illustrated in FIG. 1, the input analog signal, or the voltage across the sense resistor 102 in this instance, is typically a low frequency voltage signal. As such a very high OSR, e.g., OSR=4096 or OSR=8192, may be chosen for such an application. For this type of application, even a first order analog modulator can achieve a high precision result of greater than 14-bit resolution. Therefore, a first order modulator consistent with the invention is detailed herein with reference to FIGS. 3A and 3B. Those skilled in the art will recognize that other applications may require various order analog modulators and OSR values to achieve the desired precision for the particular application of interest.

Figure 3A:
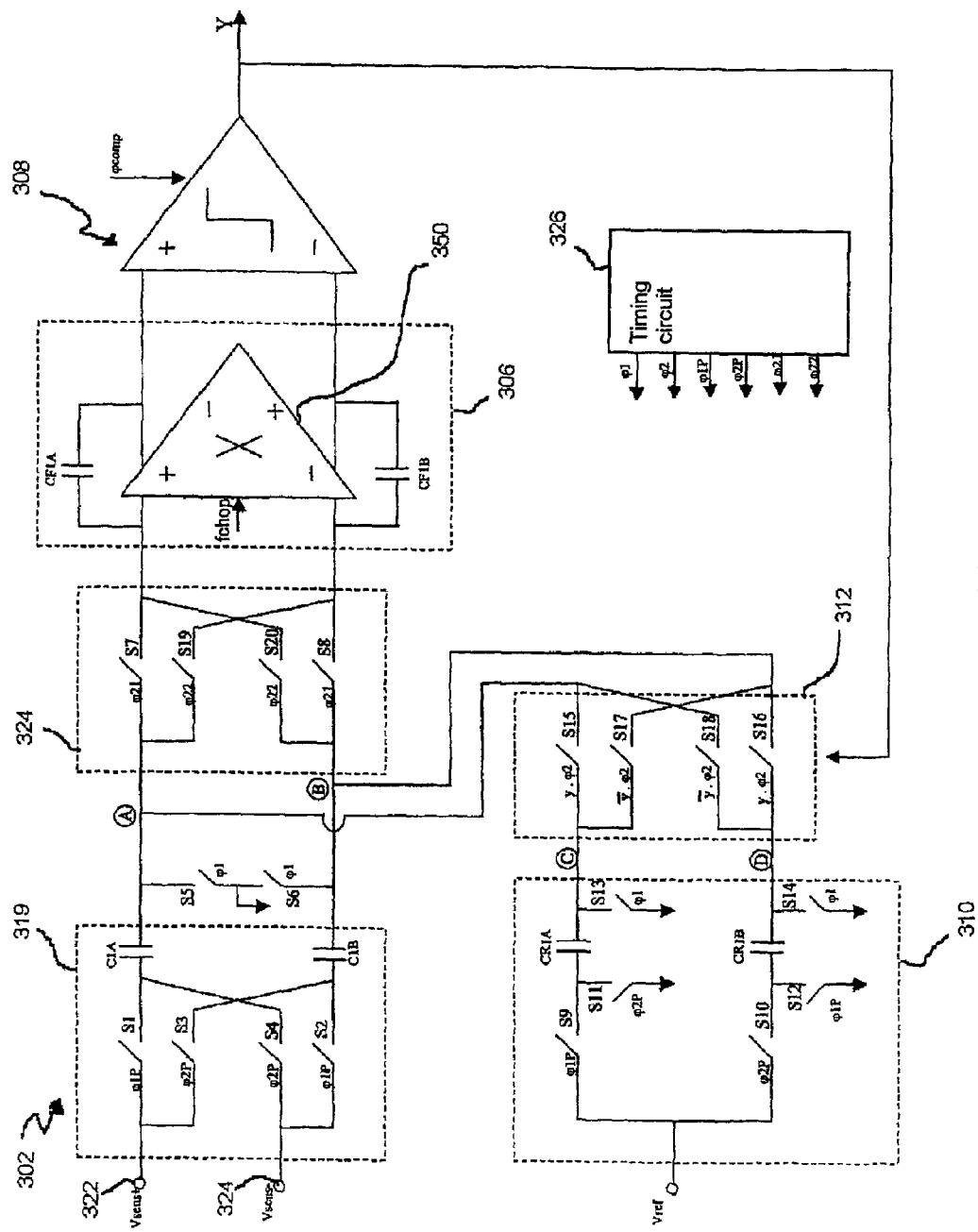
FIG. 3A is a circuit diagram of the analog modulator portion of an ADC consistent with the present invention.
Figure 3B:
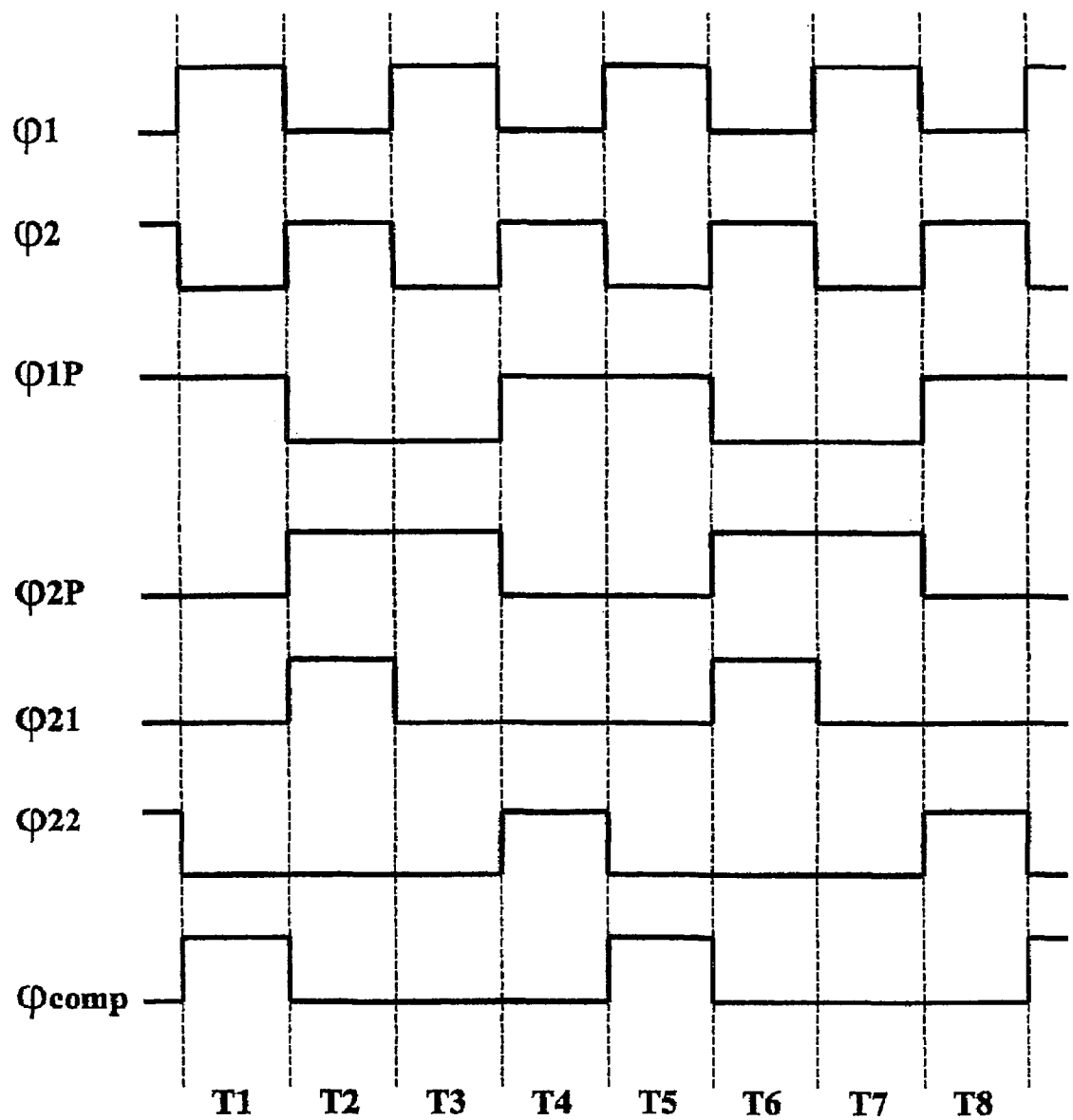
FIG. 3B is a timing diagram for the circuit of FIG. 3A.

Turning to FIG. 3A, a circuit diagram of a first order analog modulator portion 302 of a high precision ADC consistent with the invention is illustrated. FIG. 3B illustrates a timing diagram for the circuit of FIG. 3A. The analog modulator 302 generally includes an input switch array 319, a cross switch array 324, an integrator 306, a comparator 308, a 1-bit DAC 310, and a DAC switch array 312. The input switch array further includes a pair of input terminals 322, 324 to receive input analog signals, e.g., Vsense+ and Vsense− from the exemplary application illustrated in FIG. 1. Those skilled in the art will recognize that any variety of input analog signals may be input to the input terminals 322, 324. Such input analog signal may also be a differential input pair.

The input switch array 319 may further include a pair of input capacitors C1A, C1B for sampling the input analog signals during various sampling times as later detailed herein. Advantageously, the cross switch array 324 is coupled between the input switch array 319 and the integrator 306 in order to alternately transfer charges from the pair of input capacitors C1A, C1B to the pair of integration capacitors CF1A, CF1B as further detailed herein with reference to the timing diagram of FIG. 3B. The negative feedback may be furnished by a feedback switch array 312 which is controlled, in part, by the one-bit data stream Y from the comparator 308.

The various switches of the various switch arrays 319, 324, 312 and other switches of FIG. 3 are responsive to various control signals $\phi 1$, $\phi 2$, $\phi 1P$, $\phi 2P$, $\phi 21$, and $\phi 22$ as shown in the timing diagram of FIG. 3B and all such control signals are non-overlapping. As such, the various switches S1 through S20 of FIG. 3 are each labeled with an associated control signal $\phi 1$, $\phi 2$, $\phi 1P$, $\phi 2P$, $\phi 21$, or $\phi 22$. The control signals $\phi 1$, $\phi 2$, $\phi 1P$, $\phi 2P$, $\phi 21$, and $\phi 22$ are provided by a timing circuit 326. The timing circuit 326 may be any variety of configurations as understood by those skilled in the art for providing the appropriate control signals $\phi 1$, $\phi 2$, $\phi 1P$, $\phi 2P$, $\phi 21$, and $\phi 22$. In general, when an associated control signal for an associated switch is "high" the switch is closed and accordingly conducts current. In contrast, when an associated control signal for an associated switch is "low" the switch is open and accordingly does not conduct electricity. Those skilled in the art will also recognize other switch and control signal configurations where alternative switches may be responsive to alternative control signals in an ADC consistent with the present invention.

The input switch array 319 may include a plurality of switches S1, S2, S3, and S4. Such switches may be any variety of switches known to those skilled in the art, e.g., CMOS transistors may provide such a switching function. The cross switch array 324 may also include a plurality of switches S7, S8, S19, and S20. The feedback switch array 312 may also include a plurality of switches S15, S16, S17, and S18. Finally, the one-bit DAC 310 may also include a plurality of switches S9, S10, S11, S12, S13, and S14.

Operation of the exemplary first order analog modulator portion 302 of a high precision ADC consistent with the invention, including operation of the various switches detailed above, will be described herein with reference to the timing diagram of FIG. 3B. First, during time interval T1, control signals $\phi 1$, $\phi 1P$, and $\phi comp$ are high, while all other control signals are low. As such, those switches responsive to these control signals $\phi 1$, $\phi 1P$ close, while the other switches remain open. As such, switches S9, S12, S13, and S14 of the one-bit DAC 310 are closed during time interval T1. In addition, switches S1 and S2 of the input switch array 319 are also closed during time interval T1. In addition, switches S5 and S6 are closed during time interval T1.

Accordingly, the input capacitor C1A pre-samples an input analog signal input, e.g., Vsense+, from one input terminal 322 through closed switch S1, while another input capacitor C1B pre-samples an input analog signal through closed switch S2, e.g., Vsense−, at another input terminal 324. A reference capacitor CR1A of the DAC 310 samples a reference signal, e.g., a reference voltage Vref through closed switch S9, while another reference capacitor CR1B is discharged to ground through closed switches S12 and S14. The reference signal may be any type of reference signal such as a voltage or current signal. The reference voltage signals Vref of FIG. 3A may be provided from any variety of available sources depending on the application.

During time interval T2, control signals φ2, φ2P, and φ21 are high, while other control signals are low. As such, switches S3 and S4 of the input switch array 319 are closed during time interval T2 while switches S1 and S2 are open. Switches S7 and S8 of the cross switch array 324 are closed and switches S10 and S11 of the DAC 310 are closed during time interval T2. Accordingly, the input capacitor C1A transfers its pre-sampled charges accumulated during time interval T1 to the integration capacitor CF1A, and the input capacitor C1B transfers its pre-sampled charges accumulated during interval T1 to the integration capacitor CF1B.

Advantageously, because switch S4 is closed and switch S1 is open during time interval T2, the input capacitor C1A is coupled to the input voltage terminal 324 instead of ground. This permits a predetermined capacitor value for the capacitor C1A to be half that it would otherwise be if it was coupled to ground in this instance since the transfer charges are effectively doubled. Similarly, because the switch S3 is closed and the switch S2 is open, the other input capacitor C1B is coupled, to the input voltage terminal 322 instead of ground. Accordingly, a predetermined value of the input capacitor C1B can also be half that it would otherwise be if coupled to ground during this time interval. The smaller capacitor values for input capacitors C1A, C1B permit area savings on an integrated circuit (IC) which is always a premium on today's ICs.

Also during time interval T2, switch S10 and S11 are closed, so a negative reference signal, e.g., −Vref, is generated at node C and a positive reference signal, e.g., +Vref, is generated at node D. Depending on the binary feedback signal Y, the feedback switch array 312 array will couple node C with node A and node D with B, or node C with node B and node D with node A depending on if Y is 0 or 1. For instance, if Y=1, switches S15 and S16 are closed while switches S17 and S18 are open. Accordingly, node C is coupled to node A through closed switch S15, and node D is coupled to node B through closed switch S16. Alternatively, if the feedback signal Y=0, switches S15 and S16 are open while switches S17 and S18 are closed. Accordingly, node C is coupled to node B through closed switch S17, and node D is coupled to node A through closed switch S18.

During time interval T3, clock signals φ1 and φ2P are high, while all other clock signals are low. As such, the switches S3 and S4 are closed, while switches S1 and S2 are open during time interval T3. Switches S5 and S6 are also closed. Accordingly, the input capacitor C1A pre-samples the input analog signal at the input terminal 324 through closed switch S4 and the other input capacitor C1B pre-samples the input analog signal at other input terminal 322 through closed switch S3. In addition during time interval T3, switches S10, S11, S13, and S14 of the DAC 310 are closed while switches S9 and S12 of the DAC are open. Accordingly, the reference capacitor CR1A of the one-bit DAC 310 is discharged to ground through closed switches S11 and S13, while the other reference capacitor CR1B pre-samples the reference signal, e.g., reference voltage Vref, through closed switch S10.

Since control signals φ21 and φ22 are low during time interval T3, switches S7, S8, S19, and S20 of the cross switch array 306 are open and hence no charges are transferred from the input capacitors C1A, C1B to the integration capacitors CF1A, CF1B during the sampling time interval T3.

During time interval T4, control signals φ2, φ1P and φ22 are high while the remaining clock signals are low. Accordingly, switches S1 and S2 are closed while switches S3 and S4 are open. In addition, switches S19 and S20 of the cross switch array 324 are closed while switches S7 and S8 are open. Therefore, the input capacitor C1A advantageously transfers its pre-sampled charges accumulated during time interval T3 to the integration capacitor CF1B through closed switch S19. In addition, the other input capacitor C1B transfers its pre-sampled charges accumulated during time interval T3 to the integration capacitor CF1A through the closed switch S20. In this way, the cross switch array 324 is configured to transfer charges from the input capacitor C1A to the integration capacitor CF1A and from the input capacitor C1B to the integration capacitor CF1B during one time interval T2, and then to alternately transfer charges from the input capacitor C1A to the integration capacitor CF1B and from the input capacitor C1B to the integration capacitor CF1A during another time interval T4. As such, the cross switch array 324 cross couples the input capacitors C1A, C1B to the integration capacitors CF1A, CF1B.

Similarly to time interval T2, the input capacitor C1A is coupled to the input terminal 322 through closed switch S1 and the input capacitor C1B is coupled to the other input terminal 324 through closed switch S2 during time interval T4. If the input terminal 322 receives Vsense+ from the sense resistor 102 of FIG. 1 and the second input terminal 324 receives Vsense− from the sense resistor 102, the input capacitors C1A, C1B are connected to such terminals and not grounded. This thereby effectively doubles the transfer charges and enables the value of the input capacitors C1A, C1B to be half a value they would otherwise be if grounded in such an instance.

Also during time interval T4, switches S9 and S12 are closed, while the other switches on the one bit DAC 310 are open. As such, −Vref is generated at node D and +Vref is generated at node C. Depending on signal Y, the feedback switch array 312 array will couple node C with node A and node D with B, or node C with node B and node D with node A depending on the binary value of Y as earlier detailed with reference to time interval T2. As can be seen therefore, through appropriate timing control, +Vref is generated at node D through capacitor CR1B and −Vref is generated at node C through capacitor CR1A during one time interval T2, and then alternately +Vref is generated at node C through capacitor CR1A and −Vref is generated at node D through capacitor CR1B during another time interval T4. As such, +Vref and −Vref are alternately generated at node C and node D through capacitors CR1A and CR1B.

Time interval T5 is similar to time interval T1 where control signals φ, φ1P and φcomp are high while the remaining clock signals are low. As such during time interval T5, the comparator 308 accepts the integration results from the integrator 306 and generates a one-bit data output stream Y at a rate OSR×Fs. Thus, the comparator 308 functions as a one-bit ADC.

The analog modulator portion 302 of an ADC consistent with the invention has several advantages. First, the input switch array 319 enables cross sampling of the input signal at alternating input terminals 322, 324 during charge transfer time intervals, e.g., time intervals T2 and T4. This thereby effectively doubles the transfer charges and enables the value of input capacitors C1A, C1B to be half a value they would otherwise be if grounded in such instances.

In addition, the cross switch array 324 is configured to permit the input capacitor C1A to transfer its charges to the integration capacitor CF1A during one time interval, e.g., time interval T2, and then to alternately transfer charges to the other integration capacitor CF1B during another time interval, e.g., time interval T4. Similarly, the cross switch array 324 is configured to permit the other input capacitor C1B to transfer its charges to the integration capacitor CF1B during one time interval, e.g., time interval T2, and then to alternately transfer charges to the other integration capacitor CF1A during another time interval, e.g., time interval T4. Advantageously therefore, the nonlinearity and offset caused by a mismatch between input capacitors C1A, C1B and integration capacitors CF1A, CF1B is effectively eliminated. In addition, the perfect symmetry of the input analog signals, e.g., Vsense+ and Vsense−, is also not required. Absent such a configuration, a gain mismatch between CF1A/C1A and CF1B/C1B may occur resulting in an unacceptable result for applications requiring a high precision ADC.

Yet another advantage of the present invention is that for the one-bit DAC 310, +Vref and −Vref are alternately generated at node C and node D given the various switches S9, S10, S11, S12, S13, and S14 of the DAC 310 as controlled by the control signals illustrated in the timing diagram of FIG. 3B. Advantageously therefore, the nonlinearity and offset caused by a mismatch between one reference capacitor CR1A and the other reference capacitor CR1B is also effectively eliminated.

In addition, since there are two transfer or integration phases, e.g., time interval T2 and time interval T4, between a first comparison phase, e.g., time interval T1 and a second comparison phase, e.g., time interval T5, the effects of noise in the reference source signal, e.g., the Vref signal, is greatly eliminated. This enables one to lessen the noise requirements for a reference source. For example, the low frequency noise integrated during time interval T2 will be greatly diminished during time interval T4. Theoretically, this effect is equivalent to a first-order high pass filtering of the Vref noise. A simulation using a voltage reference source revealed that because of such a double sampling arrangement, the low frequency noise of Vref received a 12 dB suppression. Accordingly, the noise requirements for such a reference voltage source are greatly diminished.

In addition, the offset and low frequency noise of the operational amplifier 350 can be alleviated or eliminated by chopper-stabilized technology as illustrated in FIG. 3a or correlated double sampling (CDS) technology or auto-zeroing technology. Such chopper-stabilized technology, CDS technology, and auto-zeroing technology are known by those skilled in the art and are accordingly not discussed herein.

The embodiments that have been described herein, however, are but some of the several which utilize this invention and are set forth here by way of illustration but not of limitation. It is obvious that many other embodiments, which will be readily apparent to those skilled in the art, may be made without departing materially from the spirit and scope of the invention.

What is claimed is:

1. An analog to digital converter comprising:
   an input switch array configured to, during a first time interval, sample a first input signal to a first input capacitor and a second input signal to a second input capacitor, said input switch array further configured to, during a third time interval, sample said first input signal to said second input capacitor and said second input signal to said first input capacitor;
   an integrator having a first and second integration capacitor;
   a cross switch array coupled between said input switch array and said integrator, said cross switch array configured to, during a second time interval, transfer charges sampled during said first time interval from said first input capacitor to said first integration capacitor and charges sampled during said first time interval from said second input capacitor to said second integration capacitor, said cross switch array further configured to, during a fourth time interval, transfer charges sampled during said third time interval from said first input capacitor to said second integration capacitor and charges sampled during said third time interval from second input capacitor to said first integration capacitor, wherein said fourth time interval is after said third time interval, said third time interval is after said second time interval, said second time interval is after said first time interval and said first, second, third, and fourth time intervals are non-overlapping; and
   a one-bit digital to analog converter responsive to an output of said integrator to provide a feedback analog signal.

2. The analog to digital converter of claim 1, wherein said input switch array is configured to provide a first sample path for said first input signal to said first input capacitor and a second sample path for said second input signal to said second input capacitor during said first time interval.

3. The analog to digital converter of claim 2, wherein said input switch array is configured to provide a third sample path for said first input signal to said second input capacitor and a fourth sample path for said second input signal to said first input capacitor during said third time interval.

4. The analog to digital converter of claim 1, wherein said cross switch array is configured to provide a first transfer path from said first input capacitor to said first integration capacitor and a second transfer path from said second input capacitor to said second integration capacitor during said second time interval.

5. The analog to digital converter of claim 4, wherein said cross switch array is configured to provide a third transfer path from said first input capacitor to said second integration capacitor and a fourth transfer path from said second input capacitor to said first integration capacitor during said fourth time interval.

6. An apparatus comprising:
   an analog to digital converter (ADC), said ADC comprising:
   an input switch array configured to, during a first time interval, sample a first input signal to a first input capacitor and a second input signal to a second input capacitor, said input switch array further configured to, during a third time interval, sample said first input signal to said second input capacitor and said second input signal to said first input capacitor;
   an integrator having a first and second integration capacitor;
   a cross switch array coupled between said input switch array and said integrator, said cross switch array configured to, during a second time interval, transfer charges sampled during said first time interval from said first input capacitor to said first integration capacitor and charges sampled during said first time interval from said second input capacitor to said second integration capacitor, said cross switch array further configured to, during a fourth time interval, transfer charges sampled during said third time interval from said first input capacitor to said second integration capacitor and charges sampled during said third time interval from second input capacitor to said first integration capacitor, wherein said fourth time interval is after said third time interval, said third time interval is after said second time interval, said second time interval is after said first time interval and said first, second, third, and fourth time intervals are non-overlapping; and a one-bit digital to analog converter responsive to an output of said integrator to provide a feedback analog signal.

7. The apparatus of claim 6, wherein said input switch array is configured to provide a first sample path for said first input signal to said first input capacitor and a second sample path for said second input signal to said second input capacitor during said first time interval.

8. The apparatus of claim 7, wherein said input switch array is configured to provide a third sample path for said first input signal to said second input capacitor and a fourth sample path for said second input signal to said first input capacitor during said third time interval.

9. The apparatus of claim 6, wherein said cross switch array is configured to provide a first transfer path from said first input capacitor to said first integration capacitor and a second transfer path from said second input capacitor to said second integration capacitor during said second time interval.

10. The apparatus of claim 9, wherein said cross switch array is configured to provide a third transfer path from said first input capacitor to said second integration capacitor and a fourth transfer path from said second input capacitor to said first integration capacitor during said fourth time interval.

11. A method comprising:

during a first time interval, sampling a first input signal to a first input capacitor of an analog to digital converter (ADC) and a second input signal to a second input capacitor of said ADC;

during a second time interval, transferring charges sampled during said first time interval from said first input capacitor to a first integration capacitor of an integrator of said ADC and charges sampled during said first time interval from said second input capacitor to a second integration capacitor of said integrator;

during a third time interval, sampling said first input signal to said second input capacitor and said second input signal to said first input capacitor; and during a fourth time interval, transferring charges sampled during said third time interval from said first input capacitor to said second integration capacitor and charges sampled during said third time interval from second input capacitor to said first integration capacitor, wherein said first, second, third, and fourth time intervals are non-overlapping.

12. The method of claim 11, wherein said first and second input signals comprise first and second analog signals.

13. The method of claim 12, wherein said first analog signal is positive compared to a predetermined signal level and said second analog signal is negative compared to said predetermined signal level.

\* \* \* \* \*

UNITED STATES PATENT AND TRADEMARK OFFICE
CERTIFICATE OF CORRECTION

PATENT NO. : 7,161,520 B2 Page 1 of 1
APPLICATION NO. : 10/838563
DATED : January 9, 2007
INVENTOR(S) : Liu et al.

It is certified that error appears in the above-identified patent and that said Letters Patent is hereby corrected as shown below:

Title page, Item (73), in "Assignee", delete "Grand Cayman (KY)" and insert -- Grand Pavillion Commercial Center, West Bay Road, PO Box 32331 SMB, Georgetown Grand Cayman, Cayman Islands, BWI --, therefor.

Title page, Item (56), under "Foreign Patent Documents", line 1, after "9/1992" insert -- H03M1/12 --.

Signed and Sealed this

Eighth Day of July, 2008

JON W. DUDAS
*Director of the United States Patent and Trademark Office*